(12) United States Patent  
Fautz (10) Patent No.: US 9,400,318 B2  
(45) Date of Patent: Jul. 26, 2016

(54) METHOD FOR DETERMINING A CONTROL SEQUENCE WITH PARALLEL TRANSMISSION

(71) Applicant: Hans-Peter Fautz, Forchheim (DE)

(72) Inventor: Hans-Peter Fautz, Forchheim (DE)

(73) Assignee: Siemens Aktiengesellschaft, München (DE)

( * ) Notice: Subject to any disclaimer, the term of this patent is extended or adjusted under 35 U.S.C. 154(b) by 633 days.

(21) Appl. No.: 13/686,811

(22) Filed: Nov. 27, 2012

(65) Prior Publication Data

US 2013/0134973 A1    May 30, 2013

(30) Foreign Application Priority Data

Nov. 28, 2011 (DE) .......................... 10 2011 087 210

(51) Int. Cl.
  *G01V 3/00*        (2006.01)
  *G01R 33/54*       (2006.01)
  *G01R 33/341*      (2006.01)
  *G01R 33/58*       (2006.01)

(52) U.S. Cl.
  CPC ............ *G01R 33/543* (2013.01); *G01R 33/341* (2013.01); *G01R 33/583* (2013.01)

(58) Field of Classification Search
  CPC ............. G01R 33/543; G01R 33/5608; G01R 33/483; G01R 33/54; G01R 33/546
  USPC ....................................................... 324/309
  See application file for complete search history.

(56) References Cited

U.S. PATENT DOCUMENTS 6,230,039 B1 *  5/2001  Stuber ................... A61B 5/055  
                                                         324/307  
7,466,131 B1    12/2008 Xu et al.  
(Continued)

FOREIGN PATENT DOCUMENTS

CN      1939213 A       4/2007  
CN      102217935 A    10/2011  
DE  102007023251 A1   12/2008

OTHER PUBLICATIONS

W. Grissom et al., "Spatial Domain Method for the Design of RF Pulses in Multicoil Parallel Excitation," Magnetic Resonance in Medicine, vol. 56, No. 5, pp. 620-629, (2006).

(Continued)

*Primary Examiner* — Benjamin M Baldridge  
(74) *Attorney, Agent, or Firm* — Lempia Summerfield Katz LLC (57) ABSTRACT

A method for determining a set of control parameters of a control sequence for a magnetic resonance device is provided. The set of control parameters is chosen from a plurality of sets of basic parameters. The method includes determining a mean flip angle for each set of basic parameters in an imaging region where an object exists using the set of basic parameters with a first measuring method. For each set of basic parameters, a signal strength of a magnetic resonance signal generated in the case of a reference flip angle of a second measuring method distinguished by a signal maximum or a signal minimum is determined, and the set of basic parameters having a signal strength that is extremal in accordance with the choice of reference flip angle is chosen as the set of control parameters.

18 Claims, 3 Drawing Sheets

(56) References Cited

U.S. PATENT DOCUMENTS

| | | | |
|---|---|---|---|
| 8,581,583 B2* | 11/2013 | Greiser | A61B 5/055 324/307 |
| 2002/0107442 A1* | 8/2002 | Schreck | G01R 33/4806 600/411 |
| 2007/0035299 A1 | 2/2007 | Deimling | |
| 2007/0075707 A1 | 4/2007 | Kawai et al. | |
| 2008/0284432 A1* | 11/2008 | Nistler | G01R 33/3415 324/307 |
| 2011/0105890 A1* | 5/2011 | Niendorf | G01R 33/4833 600/413 |
| 2011/0121829 A1* | 5/2011 | Umeda | G01R 33/3678 324/309 |
| 2011/0241680 A1* | 10/2011 | Mossnang | G01R 33/5612 324/309 |
| 2011/0251477 A1 | 10/2011 | Schmitt | |
| 2012/0105060 A1* | 5/2012 | Boulant | G01R 33/4828 324/309 |
| 2012/0146639 A1* | 6/2012 | Sorensen | G01R 33/4633 324/309 |
| 2013/0144156 A1* | 6/2013 | Boulant | G01R 33/4833 600/410 |
| 2013/0249554 A1* | 9/2013 | Simonetti | G01R 33/4828 324/309 |

OTHER PUBLICATIONS

German Office Action for related German Application No. 10 2011 087 210.8, mailed May 6, 2015, with English Translation.

Chinese Office action for related Chinese Application No. 2012104948042, dated Oct. 28, 2015, with English Translation.

* cited by examiner

FIG 3

METHOD FOR DETERMINING A CONTROL SEQUENCE WITH PARALLEL TRANSMISSION

This application claims the benefit of DE 10 2011 087 210.8, filed on Nov. 28, 2011, which is hereby incorporated by reference.

BACKGROUND

The present embodiments relate to a method for determining a set of control parameters of a control sequence for a magnetic resonance device.

The imaging method of magnetic resonance is already known in the prior art. An object to be examined is introduced into a relatively high basic magnetic field (e.g., the $B_0$ field). In order to be able to acquire magnetic resonance data (e.g., in a layer), the spins of the layer are excited, and the decay, for example, in this excitation is observed as a signal. Gradient errors may be generated by a gradient coil arrangement, while high frequency excitation signals (e.g., high frequency pulses) are emitted via a high frequency transmission coil. The high frequency pulses generate a high frequency field (e.g., the $B_1$ field), and the spins of resonantly excited nuclei, spatially resolved by the gradients, are tilted by a flip angle with respect to the magnetic field lines of the basic magnetic field. If the spins of the nuclei relax again, high frequency signals are emitted. The emitted high frequency signals are picked up by suitable receiving antennae and processed further in order to be able to thus reconstruct magnetic resonance image data.

Conventional high frequency transmitting coils are operated in a "homogeneous mode," (e.g., in a "CP-Modus"). A single high frequency pulse with a defined fixed phase and amplitude is given on all components of the transmission coil (e.g., all transmission rods of a birdcage antenna). To increase the flexibility and create new degrees of freedom to improve imaging, parallel transmission, in which a plurality of transmission channels are each loaded with single pulses that may differ from each other, may also be provided. All of these single pulses, which may be described, for example, by the phase and amplitude parameters, are defined as a whole in a control sequence that is described by a corresponding set of parameters. A multi-channel pulse, which is composed of single pulses for the different transmission channels, may be a "pTX pulse" (for "parallel transmission").

Calculation methods (e.g., optimization methods) are known for determining a set of control parameters of a control sequence for a transmitter of a magnetic resonance device including a plurality of transmission channels. A target magnetization (e.g., a magnetic resonance excitation quality specification) may be specified. For example, a desired spatially resolved flip angle distribution that corresponds to a target magnetization may be given. A target function may then be defined. A suitable control sequence (e.g., the single pulses for the channels) is then determined by the optimization method (e.g., a target function optimizer). Reference is made purely by way of example for such a method for determining control sequences for parallel excitation methods to the article by W. Grissom et al., "Spatial Domain Method for the Design of RF Pulses in Multicoil Parallel Excitation", Mag. Res. Med. 56, 620-629, 2006.

Together with additional control specifications (e.g., the associated gradient pulses), the control sequence forms the measuring protocol that allows automatic control of the magnetic resonance device for a measurement.

Parallel transmission therefore permits the excitation to be spatially modulated. A class of optimizations has the aim of optimally homogeneous excitation within a certain volume or imaging region. All nuclei excited may have the same flip angle. The single pulses used, described by the set of control parameters (e.g., calculated from an optimization method), are taken as a basis for the data about the $B_1$ fields to also achieve such an homogeneous flip angle distribution or homogeneous excitation. This uses a patient- and measuring volume specific adjustment measurement that forms the basis of pulse calculation. $B_1$ maps of the individual coil elements or transmission channels may be measured for this purpose. In the case of the specific object and the specific imaging region, an analytical or numerical optimization algorithm calculates, from a basically infinite, multi-dimensional solution space for the homogeneous excitation, optimum parameters for the different degrees of freedom of the high frequency excitation (e.g., the high frequency amplitude and the high frequency phase) for each time step and each transmission channel and, optionally, additional gradients for each time step.

SUMMARY AND DESCRIPTION

The procedure described above has several drawbacks. With the known methods for measurement of the $B_1$ maps of the individual transmission channels or coil elements, a very long recording time may be given in comparison with the recording times conventional for imaging. This provides that the duration of the examination is significantly extended. The optimization algorithms may also prove to be problematical, since numerical uncertainties are present, and monitoring, for example, with respect to the SAR, is provided.

The present embodiments may obviate one or more of the drawbacks or limitations in the related art. For example, an adjusting method for determining a suitable excitation sequence characterized by shorter measuring times and more robust determination is provided.

A set of control parameters is chosen from a plurality of sets of basic parameters, in that a mean flip angle is determined for each set of basic parameters of the plurality of sets of basic parameters in an imaging region where an object exists using the set of basic parameters with a first measuring method. For each set of basic parameters, a signal strength of a magnetic resonance signal generated in the case of a reference flip angle of a second measuring method distinguished by a signal maximum or a signal minimum is determined. The set of basic parameters with a signal strength that is extremal is chosen as the set of control parameters in accordance with the choice of reference flip angle.

A patient- and imaging region- or measuring volume-specific adjustment measurement, in which no spatially high-resolution $B_1$ maps that are complex to measure are to be determined, and instead, simple spatially unresolved measuring acts are provided, from which a suitable set of control parameters may be determined almost directly and without the use of complex optimizers, is provided. The solution space is reduced to a finite number of predefined parameter settings (e.g., the sets of basic parameters; to suitable high frequency shim settings). This enables interpretable measuring acts to be carried out for each of the sets of basic parameters available for selection. In one embodiment, measurements that do not measure in a spatially resolved manner and instead provide an overall picture (e.g., a mean flip angle in the imaging region) are taken. Such measurements may be made much more quickly than measurements for $B_1$ maps, for example. Accordingly, a type of non-spatially resolved calibration of the excitation is carried out in the imaging region by determining the mean flip angle in the imaging region (e.g., matching a target volume). Aside from an embodiment yet to be discussed, the measuring parameters for the second measuring method are adapted such that maximum or minimum signal intensities are measured in the case of the mean flip angles, so the measuring parameter for the second measuring method may be calibrated by the first measurement. In one embodiment, a second measurement is carried out, therefore, by the second measuring method. A mean flip angle (possible on the basis of the first measurement) is purposefully chosen such that the mean flip angle matches the distinguished reference flip angle for the second measuring method, at which a signal maximum or signal minimum exists. The control sequence is described by a set of basic parameters that includes the maximum or minimum signal intensity (e.g., signal strength), which includes the lowest spatial variation over the imaging region.

Each excited nucleus in the imaging region provides a signal portion that is maximal or minimal if the flip angle exactly matches the reference flip angle. The more maximum or minimum portions are collected over the entire imaging region, however, the larger or smaller the resulting overall signal will be. This provides that the signal strength increases or decreases as the homogeneity of the flip angle distribution increases in the imaging region.

The set of basic parameters is chosen as the set of control parameters having a signal strength that is extremal in accordance with the choice of reference angle (e.g., with orientation toward a signal maximum that is maximal or with orientation toward a signal minimum that is minimal).

A rapid method for finding, from a limited selection of parameter settings, the sets of basic parameters to find the optimum setting for the homogenization of an imaging region is disclosed. This exploits the fact that the generated magnetic resonance signal for certain reference flip angles has a maximum or minimum signal strength. If the mean flip angle over a volume matches such a reference flip angle, the intensity of the integral magnetic resonance signal over the volume is a direct measure of the spatial variation in the flip angle. The maximum/minimum possible magnetic resonance signal is obtained for a perfectly homogeneous flip angle distribution.

Depending on the number of possible parameter settings (e.g., the different sets of basic parameters), the method allows quicker adjustment to an object and an imaging region than conventional pulse calculation methods. Owing to the limited solution space, the method reacts less sensitively to measuring errors in the adjustment measurements or to dynamic effects such as physiological movements, for example.

The imaging region, for which an adjustment or calibration is made, is freely selectable due to appropriate setting of gradients (e.g., measurements may be made non-selectively and/or selectively for a certain target volume).

In one embodiment, a second measurement is made using the second measuring method. Depending on the measured mean flip angle, at least one measuring parameter of the second measuring method is adjusted such that the distinguished reference flip angle results as the mean flip angle in the second measurement. This has already been described in detail. A measurement for determining the signal strength may be the conventional application for determining the signal strength. A second measurement is not necessary if the signal strength may be derived from the first measurement, and this embodiment is described in more detail below. The second measurement, which relates to the integral signal, does not have to occur in a spatially resolved or spatially evaluated manner, so simple, fast measurements may be carried out in this case.

Control sequences, in which the flip angle scales at least locally linearly with a transmission voltage as the measuring parameter (e.g., RF shimming control sequences) may be considered, and the transmission voltage is chosen as the measuring parameter in accordance with the distinguished reference flip angle. For example, in the case of conventional control sequences used for high frequency shimming (e.g., RF shimming), the mean flip angle linearly scales with the transmission voltage (e.g., transmitter voltage), so by adjusting the transmission voltage for the second measurement, the mean flip angle may be set to the reference flip angle. If, for example, in the first measurement, 45° is measured as the mean flip angle, the transmission voltage may be doubled for the second measurement if the reference flip angle is 90°. A special case is given if the transmission voltage only locally linearly scales with the flip angle. The measuring parameters may thus selected in the first measurement such that a mean flip angle lying in the region of the reference flip angle is anticipated. A transmission voltage is therefore selected for the first measurement. The flip angle measurement produces an anticipated flip angle that lies close to the reference flip angle for maximum/minimum signal intensity. Empirical or calibration values present, for example, in look-up tables and/or a, for example, heuristic mathematical correlation and the like may be used for this purpose.

In one embodiment, non-linear scaling and a dependency on additional measuring parameters may also exist. In this case, a look-up table allocating basic parameter set-specific, measured mean flip angles to measuring parameters may be used in order to generate the reference flip angle. Scaling of the single pulses of the control sequence from the measured mean flip angle with the reference flip angle may also be achieved by way of look-up tables.

In a further embodiment, comparable (e.g., at least partially matching) measuring methods are used as the first measuring method and the second measuring methods, so if the measured mean flip angle (e.g., within a tolerance range) matches the reference flip angle, the signal strength may be derived from the results of the first measurement. In this case, it is therefore not necessary to carry out a second measurement, since the desired result (e.g., the signal strength in the case of the reference flip angle as mean flip angle) is already known from the first measurement known or may at least be derived. For example, if the measuring sequence contains two magnetic resonance signals to be compared for determining the mean flip angle, one magnetic resonance signal based on the excitation by the basic parameter data record may also be measured with respect to the signal strength. If the mean flip angle of the first measurement matches (optionally within a tolerance range) the reference flip angle, this may be used, and one measuring process may therefore be omitted.

The sets of basic parameters may be predetermined and/or be chosen so as to be patient-specific (e.g., as a function of a preceding examination). An overview image of the object (e.g., of a patient) may be made for selection of the sets of basic parameters, and a selection (e.g., a preselection) of sets of basic parameters is made as a function of features evaluated in the overview image. All of these approaches for selection of the sets of basic parameters to be checked for suitability are based on accumulated experience or background knowledge, so, for example, a basic selection may be made on the basis of application-specific experience. If preliminary examinations exist, then a patient-specific selection may also be made available. In one embodiment, an overview image of the patient that may also be implemented in the form of a plurality of projections may be made. A series of possible sets of basic parameters may be selected on the basis of certain image features. Thus, for example, the position and form of the imaging region to be recorded (e.g., the target volume) may be analyzed, and particularly suitable sets of basic parameters may be taken for such regions, positions and forms. This may be derived, for example, on the basis of experiences in preliminary examinations, test measurements and the like.

A measuring method that allows determination of the mean flip angle by comparison of two measuring signals (e.g., a spin echo measuring method using two refocusing pulses) may be used as the first measuring method. Such measuring methods, by which a mean flip angle may be determined, are basically already known (e.g., with respect to other adjustment processes). A magnetic resonance signal during an excitation according to the set of basic parameters is compared with a magnetic resonance signal without such excitation.

A measuring method generating a gradient echo after a single excitation pulse, a measuring method recording a steady-state signal after a plurality of excitation pulses, a spin echo measuring method with one excitation pulse and at least one refocusing pulse, or a measuring method including a read-out module after a preparation pulse may be used as the second measuring method. The signal generation, which for a certain flip angle leads to a signal maximum/signal minimum, therefore includes every method known in magnetic resonance. In the example of a simple gradient echo excitation (e.g., if a simple excitation pulse is measured using a single magnetic resonance signal), this results in a sinusoidal characteristic of the signal strength against the flip angle, so the maximum is 90° as the reference flip angle.

In one embodiment, a plurality of volumes is measured as imaging regions. For example, a sequential measurement with linking of the results may be provided, for example. Linear combinations of sets of basic parameters associated with, for example, different volumes are used as possible sets of control parameters. Linear combinations of the predefined single pulses may therefore be considered (e.g., if the choice of sets of basic parameters was based on certain target volumes or imaging regions).

The sets of parameters also include at least one parameter describing a gradient pulse. The process of HF shimming may also be supported by gradient pulses. Parameters in this respect may also be included in the sets of basic parameters and therefore the determined set of control parameters as well.

In addition to the method of determination, a method for operating a magnetic resonance device having a plurality of high frequency transmission coils including transmission channels constructed for parallel transmission is provided. A control sequence is determined, and the magnetic resonance device is operated according to the determined control sequence. The most suitable control sequence may therefore also be employed completely automatically for operation of the magnetic resonance device when acquiring magnet resonance image data. The method runs completely automatically, for example, on a controller of the magnetic resonance device. All statements relating to the method of determination may be analogously applied to the operating method.

In one embodiment, a magnetic resonance device including a plurality of high frequency transmission coils having transmission channels constructed for parallel transmission is provided. The magnetic resonance device includes a controller for carrying out the method. All preceding statements relating to the method may be transferred in this case as well, so the advantages of the present embodiments may also be obtained by the magnetic resonance device.

DETAILED DESCRIPTION OF THE DRAWINGS

Figure 1:
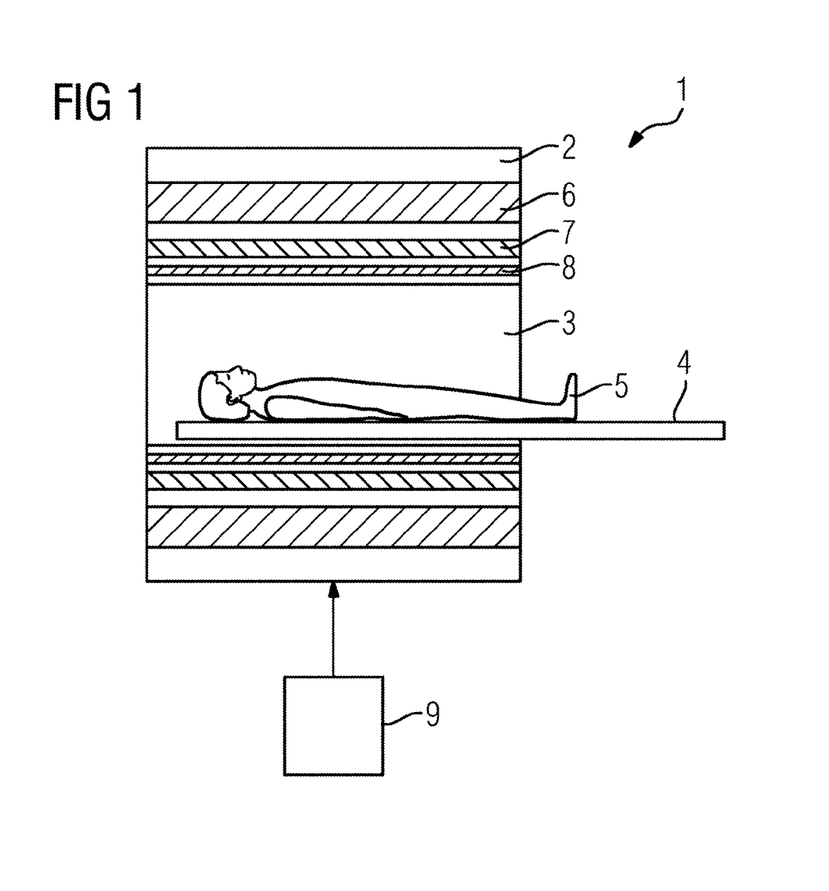
FIG. 1 shows a schematic diagram of one embodiment of a magnetic resonance device.

FIG. 1 shows a schematic diagram of one embodiment of a magnetic resonance device 1. The magnetic resonance device 1 includes a main magnetic unit 2 having a patient receiver 3 situated in the main magnetic unit 2. A patient couch 4 is movable into the patient receiver 3, so a patient 5 as object may be supported in a certain position inside the patient receiver 3.

The main magnetic unit 2 includes a basic field magnet 6, a gradient coil arrangement 7 having magnetic field gradient coils and a whole body transmission coil 8. The whole body transmission coil 8 may also be constructed to receive magnet resonance signals. In one embodiment, local coils may be arranged close to the patient 5 to receive the magnetic resonance signals.

The transmission coil 8 is constructed for parallel transmission. The transmission coil 8 may thus be controlled by a plurality of transmission channels, via which parallel single pulses of a control sequence may be provided. The associated control parameters (e.g., the frequency and the phase of the single pulses for each time step) are combined in one set of parameters.

The transmission coil 8 may be constructed by way of example as a birdcage antenna that includes a number of antenna rods running parallel and equidistantly arranged in the longitudinal direction of the patient receiver 3. At ends, the individual antenna rods are capacitively connected by an end ring. The antenna rods may be individually controlled and are associated with one transmission channel, respectively.

To be able to effect magnetic resonance images, the gradient coils of the gradient coil arrangement 7 and the transmission coil 8 are controlled with the aid of a measuring protocol that includes gradient pulses and high frequency pulses (e.g., single pulses for the individual transmission channels of transmission coil 8) that implement parallel transmission (pTX). The totality of the single pulses for the various transmission channels may be a control sequence for the transmission coil 8, and parameters of the control sequence are contained in a set of control parameters.

Parallel transmission may be used for homogenization of the excitation (e.g., flip angle distribution therefore) in the imaging region (e.g., a target volume). This may be described as high frequency shimming (HF shimming or RF shimming). To attain optimal homogeneity of excitation, a new adjustment of the magnetic resonance device 1 in terms of determining a suitable set of control parameters, a suitable control sequence is to be made with each new examination involving a new patient 5 as the object to be examined and a certain target volume as the imaging region. This occurs automatically by way of a controller 9 of the magnetic resonance device 1. The controller 9 is configured to carry out an operating method that includes a method of determination. The controller 9 is constructed to bring about control of the magnetic resonance device 1 for image data recording in accordance with a measuring protocol present in a memory of the controller 9, and also determine the measuring protocol (e.g., the control sequences). A sequence-determining device may be provided as part of the controller 9, for example.

A plurality of sets of basic parameters is therefore stored in a memory of the controller 9. A signal strength is metrologically determined for the plurality of sets of basic parameters. With the aid of the signal strength, one of the sets of basic parameters may be chosen as a set of control parameters. One exemplary embodiment of the method is explained below in more detail in relation to FIG. 2.

Figure 2:
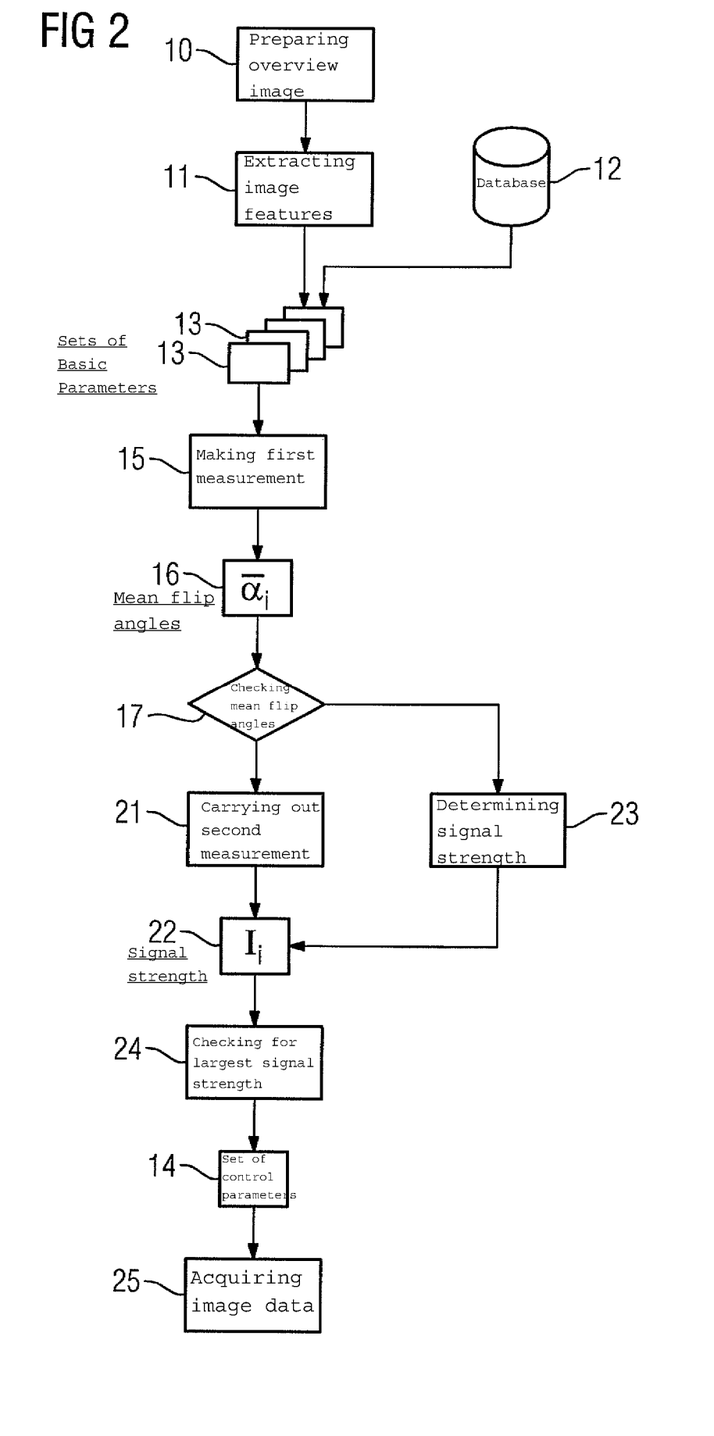
FIG. 2 shows a flow chart of one embodiment of a method for determining a set of control parameters of a control sequence.

Once the patient 5 has been suitably positioned, an overview image is prepared in act 10. The overview image may show the patient 5 as a whole or just the area around the target volume. Overview image features are extracted from this in act 11. The overview image features allow sets of basic parameters 13 to be selected from a database 12 of possible sets of basic parameters, from which the most suitable set of control parameters 14 is subsequently chosen. The position, form and/or extent of the target volume, and composition of the target volume and the like, may be used, for example, to determine appropriate candidates from the database 12.

The sets of basic parameters 13 may, however, also be completely predefined or be selected on a patient-specific basis from preliminary examinations of the patient 5.

The patient 5 is positioned such that the target volume, which also forms the imaging region, is located in the homogeneity volume of the magnetic resonance device 1.

In act 15, a first measurement is made according to a first measuring method for each set of basic parameters 13 by determining the control sequence by way of the respective set of basic parameters 13. The remaining measuring parameters are initially random, however. Mean flip angles 16, denoted in FIG. 2 by $\overline{\alpha}_i$, are measured in act 15 for each set of basic parameters 13. The i indicates that n mean flip angles 16 are measured, where n is the number of sets of basic parameters 13, and i runs from 1 to n.

The measurement is made in this connection in that a measuring method that allows a comparison of two measurement signals for determining the mean flip angle is used as the first measuring method (e.g., a spin echo measuring method using two refocusing pulses).

In act 17, whether one or a plurality of the mean flip angle(s) 16 already matches a reference flip angle is checked for a second measuring method. The reference flip angle indicates that with the reference flip angle, a maximum magnetic resonance signal is obtained in the second measuring method. This is explained in more detail by FIG. 3, in which the signal strength (intensity I) is plotted against the flip angle a (e.g., for the case of a simple gradient echo measurement). The curve 18 corresponds to a sine curve that has a maximum 19 at a reference flip angle 20 of 90°.

Figure 3:
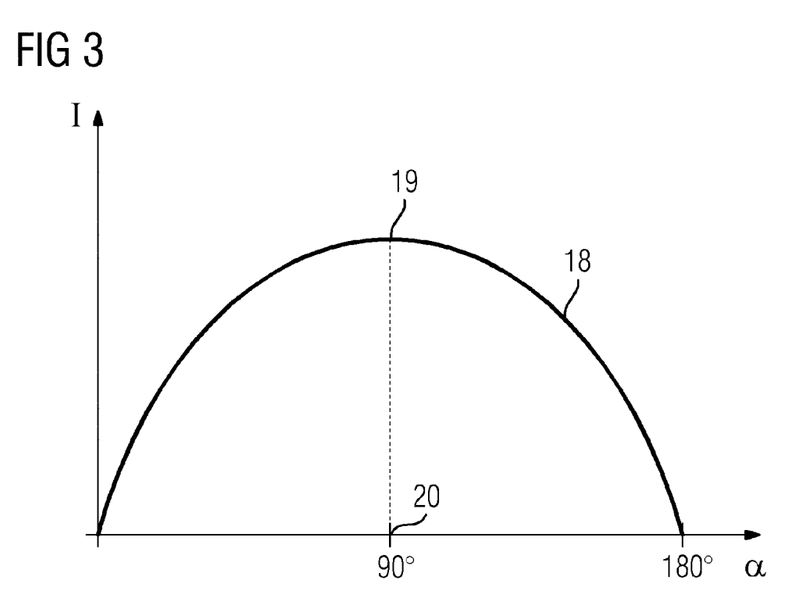
FIG. 3 shows an exemplary curve illustrating a signal strength against a flip angle for a second measuring method.

If the mean flip angle 16, which has been determined in the first measurement provided as a calibration measurement, does not match the reference flip angle 20 for a set of basic parameters 13, measuring parameters are chosen for the second measuring method such that in the second measurement carried out in act 21, reference flip angle 20 is obtained with the second measuring method as the new mean flip angle. Since control sequences of high frequency shimming, in which it is known that the mean flip angle scales with the transmission voltage, are used, the transmission voltage as measuring parameter scales such that reference flip angle 20 is obtained. In the illustrated example, the transmission voltage for the second measurement is therefore doubled in act 21 with a measured mean flip angle 16 of 45°. Signal strengths 22, designated $I_i$ in FIG. 2, are obtained in act 21 as the measuring result of the second measurement.

If it has been found that the mean flip angle 16, which was measured in the first measurement in step 15, already matches the reference flip angle 20, in act 23, the corresponding signal strength 22 is determined from the results of the first measurement in act 15, since the first measuring method and the second measuring method have been chosen such that the first measuring method and the second measuring method partially match. Therefore, the results of the first measuring method may be transferred to the second measuring method. A second measurement in act 21 is not necessary in this case, therefore.

Measuring parameters with the mean flip angle in the control sequences may be adjusted even in the case of non-straightforward linear scaling of measuring parameters. If there is only a local linear dependency on a measuring parameter (e.g., the transmission voltage), then, for example, the measuring parameters for the first measurement may have already been selected such that, as expected, a mean flip angle 16 lying at least in the range of the reference flip angle 20 (e.g., in a range providing sufficient linearity up to the reference flip angle) is measured, so the local linearity may be used. In other cases, where more complex connections exist between the mean flip angles and the measuring parameters, suitable look-up tables stored in a memory device of the controller 9 may, for example, be used.

Once the two measurements have been made in acts 15 and 21, signal strengths 22 therefore exist for each set of basic parameters 13. In act 24, which of the signal strengths 22 is the largest is checked. The maximum of $I_i$ is therefore determined therefore. The corresponding set of basic parameters 13 is then obtained as the set of control parameters 14 to be used.

This is based on the consideration that if the mean flip angle over the imaging region matches the reference flip angle 20, the signal strength of the integral magnetic resonance signal over the imaging region constitutes a direct measure of the spatial variation in the flip angle. The fact that the generated magnetic resonance signal (cf., FIG. 3) for the reference flip angle 20 reaches an intensity maximum or minimum is used. For homogeneous signal excitation, the maximal/minimal possible signal strength is obtained, while in the case of differences in the actually present flip angle from the reference flip angle 20 in the mean flip angle corresponding to the second measurement, there is a reduction in the overall signal strength.

Image data is acquired using the magnetic resonance device 1 in act 25. The control parameters of the set of control parameters 14 may be used accordingly, as part of a measuring protocol.

The sets of basic parameters or sets of control parameters may also include parameters relating to gradient pulses, since an adjustment of the gradient control within the framework of homogenization of the flip angle distribution may also be provided.

Although the invention has been illustrated and described in more detail by way of the exemplary embodiments, the invention is not limited by the disclosed examples, and other variations may be derived herefrom by the person skilled in the art without departing from the scope of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a set of control parameters of a control sequence for a magnetic resonance device that allows optimally homogeneous excitation for an object to be recorded and imaging regions, the control sequence comprising single pulses that are to be emitted in parallel for a plurality of individually controllable high frequency transmission channels, wherein the set of control parameters is chosen from linear combinations of sets of basic parameters of a plurality of sets of basic parameters associated with different volumes of a plurality of volumes, the basic parameters comprising a high frequency amplitude and a high frequency phase for each transmission channel, the method comprising:
   measuring the plurality of volumes as the imaging regions;
   determining a mean flip angle for each set of basic parameters of the plurality of sets of basic parameters in the imaging region where the object exists, the determining using the set of basic parameters with a first measuring method;
   determining, for each set of basic parameters of the plurality of sets of basic parameters, a signal strength of a magnetic resonance signal generated in the case of a reference flip angle of a second measuring method at which a signal maximum or a signal minimum exists; and
   selecting, using the linear combinations of the sets of basic parameters associated with the different volumes, the set of basic parameters of the plurality of sets of basic parameters having a signal strength for the reference flip angle as the set of control parameters.

2. The method as claimed in claim 1, further comprising:
   performing a second measurement using the second measuring method; and
   adjusting, depending on the determined mean flip angle, at least one measuring parameter of the second measuring method such that the distinguished reference flip angle results as the mean flip angle in the second measurement.

3. The method as claimed in claim 2, wherein control sequences, in which a flip angle scales linearly with a transmission voltage, are considered, and
   wherein the transmission voltage is chosen as the at least one measuring parameter in accordance with the distinguished reference flip angle.

4. The method as claimed in claim 3, wherein the control sequences comprise radio frequency (RF) shimming control sequences.

5. The method as claimed in claim 3, wherein with a transmission voltage scaling linearly with the flip angle, the at least one measuring parameters are chosen in the first measurement such that a mean flip angle lying in a region of the reference flip angle is anticipated.

6. The method as claimed in claim 2, further comprising generating the reference flip angle using a look-up table, allocating set-specific, measured mean flip angles to measuring parameters.

7. The method as claimed in claim 2, wherein matching measuring methods are used as the first measuring method and the second measuring methods such that when the determined mean flip angle matches the reference flip angle within a tolerance range, the signal strength is derived from results of the first measurement.

8. The method as claimed in claim 1, wherein matching measuring methods are used as the first measuring method and the second measuring methods such that when the determined mean flip angle matches the reference flip angle within a tolerance range, the signal strength is derived from results of the first measurement.

9. The method as claimed in claim 1, wherein the plurality of sets of basic parameters is selected so as to be patient-specific.

10. The method as claimed in claim 1, wherein the plurality of sets of basic parameters is predetermined as a function of a preceding examination.

11. The method as claimed in claim 1, further comprising generating an overview image of the object to choose the plurality of sets of basic parameters,
   wherein the plurality of sets of basic parameters is chosen as a function of features evaluated in the overview image.

12. The method as claimed in claim 11, wherein the overview image is of the object.

13. The method as claimed in claim 1, wherein a measuring method that allows determination of the mean flip angle by comparison of two measuring signals is used as the first measuring method.

14. The method as claimed in claim 13, wherein the measuring method comprises a spin echo measuring method using two refocusing pulses.

15. The method as claimed in claim 1, wherein a measuring method generating a gradient echo after a single excitation pulse, a measuring method recording a steady-state signal after a plurality of excitation pulses, a spin echo measuring method with one excitation pulse and at least one refocusing pulse, or a measuring method comprising a read-out module after a preparation pulse is used as the second measuring method.

16. The method as claimed in claim 1, wherein the plurality of sets of basic parameters includes at least one parameter comprising a gradient pulse.

17. A method for operating a magnetic resonance device having a plurality of high frequency transmission coils comprising transmission channels constructed for parallel transmission, the method comprising:
   determining a set of control parameters of a control sequence that allows optimally homogeneous excitation for an object to be recorded and imaging regions, the control sequence comprising single pulses that are to be emitted in parallel for the transmission channels, wherein the set of control parameters is chosen from linear combinations of sets of basic parameters of a plurality of sets of basic parameters associated with different volumes of a plurality of volumes, the basic parameters comprising a high frequency amplitude and a high frequency phase for each transmission channel, the determination of the set of control parameters comprising:
   measuring the plurality of volumes as the imaging regions;
   determining a mean flip angle for each set of basic parameters of the plurality of sets of basic parameters in an imaging region where the object exists, the determining using the set of basic parameters with a first measuring method;
   determining, for each set of basic parameters of the plurality of sets of basic parameters, a signal strength of a magnetic resonance signal generated in the case of a reference flip angle of a second measuring method at which a signal maximum or a signal minimum; and selecting, using the linear combinations of the sets of basic parameters associated with the different volumes, the set of basic parameters of the plurality of sets of basic parameters having a signal strength for the reference flip angle as the set of control parameters; and operating the magnetic resonance device according to the determined control sequence.

18. A magnetic resonance device comprising:

a plurality of high frequency-transmission coils comprising transmission channels configured for parallel transmission; and a controller configured to determine a set of control parameters of a control sequence for a magnetic resonance device that allows optimally homogeneous excitation for an object to be recorded and imaging regions, the control sequence comprising single pulses that are to be emitted in parallel for a plurality of individually controllable high frequency transmission channels, wherein the set of control parameters is chosen from linear combinations of sets of basic parameters of a plurality of sets of basic parameters associated with different volumes of a plurality of volumes, the basic parameters comprising a high frequency amplitude and a high frequency phase for each transmission channel, wherein the controller is further configured to:

measure the plurality of volumes as the imaging regions;

determine a mean flip angle for each set of basic parameters of the plurality of sets of basic parameters in an imaging region where the object exists using the set of basic parameters with a first measuring method;

determine, for each set of basic parameters of the plurality of sets of basic parameters, a signal strength of a magnetic resonance signal generated in the case of a reference flip angle of a second measuring method at which a signal maximum or a signal minimum; and select, using the linear combinations of the sets of basic parameters associated with the different volumes, the set of basic parameters of the plurality of sets of basic parameters having a signal strength for the reference flip angle as the set of control parameters.

\* \* \* \* \*